US007838180B2

(12) United States Patent
Nozawa et al.

(10) Patent No.: US 7,838,180 B2
(45) Date of Patent: Nov. 23, 2010

(54) MASK BLANK, METHOD OF MANUFACTURING AN EXPOSURE MASK, AND METHOD OF MANUFACTURING AN IMPRINT TEMPLATE

(75) Inventors: Osamu Nozawa, Shinjuku-ku (JP); Mitsuhiro Kureishi, Shinjuku-ku (JP)

(73) Assignee: Hoya Corporation, Tokyo (JP)

( * ) Notice: Subject to any disclaimer, the term of this patent is extended or adjusted under 35 U.S.C. 154(b) by 329 days.

(21) Appl. No.: 12/038,826

(22) Filed: Feb. 28, 2008

(65) Prior Publication Data
US 2008/0206655 A1 Aug. 28, 2008

(30) Foreign Application Priority Data
Feb. 28, 2007 (JP) .............................. 2007-049084

(51) Int. Cl.
*G03F 1/00* (2006.01)
(52) U.S. Cl. ........................................................ 430/5
(58) Field of Classification Search .................... 430/5, 430/323, 394; 428/428, 430; 216/58
See application file for complete search history.

(56) References Cited
U.S. PATENT DOCUMENTS
2002/0122991 A1 * 9/2002 Shiota et al. .................... 430/5
2005/0208393 A1 * 9/2005 Dieu et al. ...................... 430/5

FOREIGN PATENT DOCUMENTS
JP 2005-530338 A 10/2005
JP 2006-78825 A 3/2006

* cited by examiner

*Primary Examiner*—Stephen Rosasco
(74) *Attorney, Agent, or Firm*—Sughrue Mion, PLLC

(57) ABSTRACT

A mask blank includes a substrate and a thin film formed thereon and used to form a pattern. The mask blank is adapted to be subjected to dry etching corresponding to a method of producing an exposure mask by patterning the thin film by dry etching using an etching gas substantially free from oxygen with a resist pattern formed on the thin film used as a mask. The thin film has a protective layer formed at least at its upper layer and containing 60 atomic % or more oxygen. For example, the dry etching is performed by the use of a chlorine-based gas substantially free from oxygen.

10 Claims, 7 Drawing Sheets

MASK BLANK, METHOD OF MANUFACTURING AN EXPOSURE MASK, AND METHOD OF MANUFACTURING AN IMPRINT TEMPLATE

This application is based upon and claims the benefit of priority from Japanese patent application No. 2007-49084, filed on Feb. 28, 2007, the disclosure of which is incorporated herein in its entirety by reference.

BACKGROUND OF THE INVENTION

This invention relates to a mask blank for use in producing an integrated circuit such as a semiconductor and an optical component having an optical function provided by a fine or microscopic pattern, a method of manufacturing an exposure mask, and a method of manufacturing an imprint template.

Generally, in a manufacturing process of a semiconductor device or the like, a fine pattern is formed by the use of photolithography. In order to form the fine pattern, a plurality of substrates called photomasks are used. The photomask generally includes a light-transmitting glass substrate and a light-shielding fine pattern formed on the substrate and comprising a metal thin film or the like. In manufacture of the photomask, photolithography is used also.

The above-mentioned photomask or an imprint template is used as a master for transferring the same fine pattern onto a large number of objects. The dimensional accuracy of the pattern formed on the photomask directly affects the dimensional accuracy of the fine pattern to be produced by pattern transfer. In case of the imprint template, a sectional shape of the pattern formed on the template also affects the shape of the fine pattern to be produced by pattern transfer. With the improvement in degree of integration of a semiconductor circuit, the dimension of the pattern is reduced and the photomask or the imprint template is required to have higher accuracy. Similarly, an optical component having an optical function provided by a fine pattern such as grating is also required to have a pattern dimension smaller than a target wavelength and pattern accuracy. Therefore, the photomask or the imprint template for use in production of the optical component is also required to have a microscopic and high-accuracy pattern.

In production of a conventional photomask and a conventional imprint template, use is made of a mask blank comprising a light-transmitting substrate, such as a quartz glass, and a thin film, such as a chromium film, formed on the substrate. After a resist is applied onto the mask blank, a resist pattern is formed by the use of EB (electron beam) exposure or the like. Using the resist pattern as a mask, the thin film is etched to thereby form a thin film pattern (mask pattern).

In order to further improve the resolution upon pattern transfer, the photomask may be produced as a phase shift mask. The phase shift mask is obtained by patterning, using the thin film pattern as a mask, the light-transmitting substrate or a light semi-transmitting film formed between the substrate and the thin film. In the imprint template, in order to irradiate light upon transfer, a step pattern may be formed on the light-transmitting substrate with the thin film pattern used as a mask. In either event, the dimensional accuracy of the light-transmitting substrate is directly affected by the dimensional accuracy of the thin film pattern.

For example, as means for etching the thin film containing chromium, use is generally made of wet etching using di-ammonium cerium (IV) nitrate or dry etching using a mixed gas containing a chlorine-based gas and oxygen.

Japanese Unexamined Patent Application Publication (JP-A) No. 2005-530338 (Patent Document 1) discloses a method in which a thin film pattern comprising a plurality of layers is formed by the use of multi-stage etching in order to avoid nonuniformity in etching width or depth of the chromium film. Japanese Unexamined Patent Application Publication (JP-A) No. 2006-78825 (Patent Document 2) discloses a method in which a relatively thin film pattern is formed with a resist pattern used as a mask and then, using the thin film pattern as a mask, thin film patterns of second and subsequent layers are formed. This method is intended to reduce the thickness of the resist.

SUMMARY OF THE INVENTION

With the increase in degree of integration of a semiconductor circuit, the pattern is required to have a finer dimension. When the pattern has a finer dimension, there arises a problem in forming, for example, a chromium pattern either by wet etching or dry etching. The above-mentioned wet etching using di-ammonium cerium (IV) nitrate is advantageous in that recession or disappearance of a resist rarely occurs. On the other hand, the above-mentioned wet etching is disadvantageous in that the chromium pattern does not have vertical profiles in section, that the chromium film is etched in a horizontal direction in section to be varied in dimension with respect to the resist pattern (etching bias), and so on.

On the other hand, in dry etching using a mixed gas containing a chlorine-based gas and oxygen, the chromium pattern has vertical profiles in section as compared with the wet etching. However, there arises a problem such as recession or disappearance of a resist. Further, like in the wet etching, there is a problem of occurrence of the above-mentioned etching bias.

In particular, in either etching technique, the etching bias and the etching depth are nonuniform depending upon the widths to be etched. For example, if both a narrow part having a width not greater than 100 nm and a wide part having a width not smaller than 1 µm are simultaneously etched, the narrow part becomes relatively narrow and small in etching depth. This phenomenon is known in the art. If the etching bias is different depending upon the width to be etched, it is difficult to perform correction, such as data bias, to preliminarily adjust a line width upon exposure. This problem is more remarkable in case of the wet etching.

In the dry etching using a chlorine-based gas containing oxygen, etching of the resist progresses not only in a thickness direction of the resist but also in the horizontal direction in section of the resist. Therefore, while the chromium film is dry-etched, the width of the resist is varied and, as a result, the width of the chromium pattern is varied also with respect to the width of the resist before etching. Furthermore, the chromium pattern itself is gradually etched in the horizontal direction in section. Therefore, the width of the chromium pattern is narrower than a desired dimension. Sometimes, such narrow pattern itself disappears.

In case where the dimension of the pattern becomes finer, restriction is imposed upon the thickness of the resist in addition to the problem of etching bias of the chromium film. If the thickness of the resist is greater than approximately three times the pattern width, there arise problems such as decrease in resolution during exposure of the resist and collapse of the resist pattern after the pattern is formed. In case where the chromium pattern is formed by dry etching using the chlorine-based gas containing oxygen, the resist is gradually eliminated by etching. If the thickness of the resist is reduced, the resist disappears before completion of formation of the chromium pattern and a part of the chromium pattern which should not be etched will be etched. In the dry etching using a chlorine-based gas containing oxygen, the resist of a thickness equal to or greater than the thickness of chromium is consumed. Furthermore, in order to remove nonuniformity in etching depth, additional etching or overetching of twice or more long is performed. During the additional etching, the thickness of the resist is reduced. Accordingly, in order to avoid disappearance of the resist in dry etching, the thickness of the chromium film is limited to about ⅓ of the thickness of the resist at maximum. For example, in case where the resist pattern having a width of 30 nm is formed, the thickness of the resist is 90 nm or less so as to avoid collapse of the pattern and the thickness of the chromium film is about 30 nm or less which is equal to or less than the pattern width so as to avoid disappearance of the resist after etching.

In the meanwhile, the photomask does not have a sufficient light-shielding function if the thickness of the thin film (light-shielding film) pattern is reduced. For example, in order to obtain the optical density of 3 or more (transmittance of 0.1% or less), the thin film pattern, for example, made of chromium, must have a thickness of at least 45 nm. Taking the thickness of the pattern alone into consideration, the lower limit of the pattern dimension is 45 nm. However, since recession of the resist and the chromium pattern occurs during formation of the chromium pattern as mentioned above, the lower limit of the pattern dimension which can be accurately produced is greater than 45 nm.

In an actual photomask, due to limitations such as presence of an anti-reflection film, recession of the resist, progress of etching in the horizontal direction in section of the pattern, nonuniformity in etching depth depending upon the line width, uniformity throughout an entire surface of the mask, the limit of the pattern dimension is approximately twice the pattern dimension in order to accurately produce the chromium film having a thickness of 45 nm and having an optical density of 3 or more at the exposure wavelength of 193 nm. Accordingly, limitation is imposed upon accomplishment of a finer pattern by the conventional technique.

In order to avoid nonuniformity in etching width or depth of the chromium film, the above-mentioned method disclosed in Patent Document 1 is known in which a thin film pattern comprising a plurality of layers is formed by multi-stage etching. In this method, nonuniformity in etching depth is avoided by an etch stopper. However, Patent Document 1 discloses neither a technique of preventing recession of the resist width resulting in nonuniformity in etching width nor a technique of achieving reduction in thickness of the resist as required in formation of a fine pattern. Thus, Patent Document 1 does not sufficiently solve the problems in the conventional technique in realizing a fine pattern.

As a method of suppressing the influence upon the pattern width by variation in resist width during dry etching and enabling the resist to be reduced in thickness, the above-mentioned method disclosed in Patent Document 2 is known in which a relatively thin film pattern is formed with a resist pattern used as a mask and, using the thin film pattern as a mask, thin film patterns of second and subsequent layers are formed. In this method, a chlorine-based gas containing oxygen or a fluorine gas is used as an etching gas used when the thin film is etched with the resist pattern used as a mask. With either etching gas, recession of the resist pattern occurs during dry etching. Therefore, the pattern accuracy is not excellent.

In view of the above-mentioned disadvantages in the conventional technique, it is a first object of this invention to provide a mask blank capable of forming a fine pattern with high pattern accuracy in manufacture of an exposure mask.

It is a second object of this invention to provide a method of producing an exposure mask having a high-accuracy fine pattern formed by the use of the above-mentioned mask blank.

It is a third object of this invention to provide a method of producing an imprint template having a high-accuracy fine pattern formed by the use of the above-mentioned mask blank.

This invention provides the following structures in order to achieve the above-mentioned object.

(Structure 1)

A mask blank, comprising a substrate and a thin film formed on the substrate and used to form a pattern, wherein:

the mask blank is adapted to be subjected to dry etching corresponding to a method of producing an exposure mask by patterning the thin film by dry etching using an etching gas substantially free from oxygen with a resist pattern formed on the thin film used as a mask;

the thin film having a protective layer formed at least at an upper layer, the upper layer containing 60 atomic % or more oxygen.

(Structure 2)

The mask blank according to Structure 1, wherein the upper layer contains 65 atomic % or more oxygen.

(Structure 3)

The mask blank according to Structure 1, wherein the dry etching is performed by the use of a chlorine-based gas substantially free from oxygen.

(Structure 4)

The mask blank according to Structure 1, wherein the thin film comprises a laminate film composed of the protective layer and a light-shielding layer.

(Structure 5)

The mask blank according to Structure 1, wherein the protective layer contains, as a component except oxygen, chromium (Cr) as a main component.

(Structure 6)

The mask blank according to Structure 1, wherein a remaining part of the thin film except the upper layer is formed by a material containing, as a main component, at least one element selected from tantalum (Ta), hafnium (Hf), and zirconium (Zr).

(Structure 7)

A method of manufacturing an exposure mask, wherein the thin film of the mask blank according to Structure 1 is patterned by dry etching using an etching gas substantially free from oxygen.

(Structure 8)

The method according to Structure 7, wherein the etching gas is a chlorine-based gas substantially free from oxygen.

(Structure 9)

A method of manufacturing an imprint template, wherein the thin film of the mask blank according to Structure 1 is patterned by dry etching using an etching gas substantially free from oxygen to form a thin film pattern and the substrate is etched using the thin film pattern as a mask.

As described in Structure 1, this invention provides a mask blank comprising a substrate and a thin film formed on the substrate and used to form a pattern, wherein the mask blank is adapted to be subjected to dry etching corresponding to a method of producing an exposure mask by patterning the thin film by dry etching using an etching gas substantially free from oxygen with a resist pattern formed on the thin film used as a mask; the thin film having a protective layer formed at least at an upper layer and containing 60 atomic % or more oxygen.

By the mask blank according to this invention, it is possible to form a fine pattern with high pattern accuracy in manufacture of an exposure mask and the like. In a phase shift mask produced by etching a light-transmitting substrate or a light semi-transmitting film (phase shift film) with a light-shielding pattern such as a chromium pattern used as a mask, the light-shielding pattern can be formed as a high-accuracy fine pattern by the use of the mask blank according to this invention. Therefore, as a pattern formed on the light-transmitting substrate or the light semi-transmitting film by etching using the light-shielding pattern as a mask, a high-accuracy fine pattern can be formed also.

The mask blank according to this invention is not limited to a mask blank which is for use in manufacture of a so-called binary mask and which comprises a light-transmitting substrate and a light-shielding film formed thereon but may be, for example, a mask blank which is for use in manufacture of a halftone phase shift mask and which comprises a light-transmitting substrate, a halftone phase shift film formed on the substrate, and a light-shielding film formed on the halftone phase shift film. Furthermore, the mask blank according to this invention may be a reflective mask blank which is for use in manufacture of a reflective mask used in extreme ultra violet (hereinafter abbreviated to EUV) exposure and which comprises a substrate and, for example, a multi-layer reflective film and an absorber film formed on the substrate to reflect exposure light and to absorb the exposure light (to prevent reflection of the exposure light), respectively. Furthermore, the mask blank according to this invention may be a mask blank (template blank) which is for use in manufacture of an imprint template and which comprises a light-transmitting substrate and a light-shielding film formed thereon. In short, the mask blank according to this invention encompasses any mask blank of a structure in which a thin film for forming a pattern is formed on the substrate.

As the light-transmitting substrate, a glass substrate such as a quartz substrate is typically used. The glass substrate is excellent in flatness and smoothness so that, when pattern transfer onto a semiconductor substrate is performed by the use of the photomask, high-accuracy pattern transfer is achieved without causing distortion of a transfer pattern and so on. As the substrate for the reflective mask blank, a low-thermal-expansion glass substrate is preferable.

The mask blank according to this invention is adapted to be subjected to dry etching corresponding to a method of producing an exposure mask by patterning the thin film by dry etching using an etching gas substantially free from oxygen with a resist pattern formed on the thin film used as a mask.

In order to form a fine pattern with high accuracy, it is necessary to reduce a thickness of a resist, to suppress progress of etching in a horizontal direction in section of a resist pattern (to suppress recession of the resist), and to suppress progress of etching in a horizontal direction in section of a thin film pattern (to suppress isotropic etching). In case where the thin film pattern is formed by wet etching, progress of etching in the horizontal direction in section of the thin film pattern inherently and inevitably occurs. Therefore, in order to form a fine pattern, dry etching is preferable as in this invention.

In order to reduce the thickness of the resist when the thin film pattern is formed by dry etching, there is a technique of decreasing an etching rate of the resist or reducing an etching time of the thin film subjected to patterning with the resist pattern used as a mask.

In dry etching of the exposure mask or the imprint template, a mixed gas of chlorine and oxygen or a fluorine-based gas is generally used as an etching gas. The mask blank according to this invention is a mask blank for dry etching using an etching gas substantially free from oxygen. In particular, in dry etching using a chlorine-based gas substantially free from oxygen, progress of etching in the horizontal direction in section of the resist pattern is slow as compared with etching using a chlorine-based gas containing oxygen or etching using a fluorine-based gas. Therefore, it is possible to suppress variation in dimension of the resist. Thus, in this invention, dry etching using a chlorine-based gas substantially free from oxygen as described in Structure 3 is most preferable. It is noted here that "substantially free from oxygen" encompasses the case where no oxygen is contained at all and the case where the content of oxygen is not greater than 5% even if oxygen generated in an etching apparatus is contained.

In order to reduce the etching time of the thin film, there are techniques of increasing a dry etching rate of the thin film for forming a pattern and of reducing the thickness of the thin film for forming a pattern. In the exposure mask, in view of assuring a light shielding effect at an exposure wavelength, the thin film must have a thickness not smaller than a predetermined thickness. Thus, limitation is imposed in reducing the thickness of the thin film. Accordingly, it is necessary to select a material having a high dry etching rate as the thin film (pattern-forming layer). In the mask blank according to this invention, the protective layer containing 60 atomic % or more oxygen is formed at least at the upper layer. With this structure, a high dry etching rate is obtained in etching using a substantially oxygen-free gas, for example, a substantially oxygen-free chlorine-based gas and a sufficient resistance is assured against cleaning using ammonia water or a mixture of sulfuric acid and hydrogen peroxide in a production process of the exposure mask. Furthermore, a remaining part of the thin film other than the upper layer is preferably formed by a material having a high dry etching rate in etching using a substantially oxygen-free gas, for example, a substantially oxygen-free chlorine-based gas and having a sufficient resistance against the above-mentioned cleaning. As such a material, use may be made of tantalum, hafnium, zirconium, and metallic silicon. Because of a reason which will later be described, tantalum, hafnium, and zirconium are preferable in this invention.

In order to suppress etching in the horizontal direction in section of the thin film pattern, there are techniques of selecting a material which requires ion bombardment for progress of the dry etching and of adding an etching gas which causes deposition on side walls of the pattern. In the etching using a substantially oxygen-free gas, for example, a substantially oxygen-free chlorine-based gas, the etching rate of the resist is low. If a deposition gas (for example, a gas containing at least one of carbon and silicon and either chlorine or fluorine) suppressing etching of the side walls of the thin film pattern is used, foreign matters which are not removable may be formed on the surface and the side walls of the pattern during additional etching (over etching) or depending upon the surface area of the resist. Therefore, in the etching using a substantially oxygen-free gas, it is preferable that the deposition gas is not added.

As a material satisfying the conditions that progress of etching in the horizontal direction in section of the thin film pattern hardly occurs in the state where no deposition gas is added, that a high etching rate is obtained in etching using a substantially oxygen-free gas, for example, a substantially oxygen-free chlorine-based gas, and that a sufficient resistance is assured against the above-mentioned cleaning, use is preferably made of a material containing, as a main component, at least one element selected from tantalum, hafnium, and zirconium. Furthermore, as a material controlling optical characteristics and crystallinity of the thin film and having less influence upon dry etching, an element such as tungsten, carbon, nitrogen, or boron may be added to the thin film. Silicon and metallic silicon are disadvantageous in that, without using the deposition gas, etching progresses in the horizontal direction in section of the pattern.

It is noted here that, in case where the thin film exclusively comprises the above-mentioned material containing, as a main component, at least one element selected from tantalum, hafnium, and zirconium, an etching rate in etching using a substantially oxygen-free gas, for example, a substantially oxygen-free chlorine-based gas may be significantly decreased because of oxidization in a resist applying step or during leaving in atmosphere in a mask blank manufacturing process. In this invention, the protective layer containing oxygen at a high concentration is formed at the upper layer of the thin film so as to prevent decrease in dry etching rate due to the above-mentioned oxidization.

In this invention, since the protective layer containing 60 atomic % or more is formed at the upper layer of the thin film, a high etching rate is obtained in dry etching of the thin film using a substantially oxygen-free gas, for example, a substantially oxygen-free chlorine-based gas. The protective layer containing oxygen at a high concentration is preferably formed by a metal oxide which can be dry-etched using a substantially oxygen-free gas, such as a substantially oxygen-free chlorine-based gas and which has a sufficient cleaning resistance. Among various metal oxides, a chromium oxide containing, as a component except oxygen, chromium as a main component is preferable.

FIG. 1 shows the relationship between the oxygen concentration in a chromium oxide film and the etching rate. Specifically, chromium oxide films having different oxygen concentrations were prepared and an electron beam resist pattern was formed on each film. Then, etching using an oxygen-free chlorine-based gas was carried out. When the oxygen concentration in the film is 60 atomic % or more, the etching rate of the chromium oxide film is not smaller than 1/3 with respect to the etching rate of the resist. In the conventional technique, it is supposed that a chromium compound containing oxygen is resistant against etching using an oxygen-free chlorine-based gas (for example, see Patent Document 2). However, according to the study of the present inventor, the chromium oxide film has an etching rate corresponding to 1/3 or more with respect to the etching rate of the resist and can be etched by a substantially oxygen-free gas, for example, a substantially oxygen-free chlorine-based gas. Therefore, the chromium oxide film containing 60 atomic % or more oxygen is preferable as a protective layer at the upper layer of the thin film formed by the material containing, as a main component, at least one element selected from tantalum, hafnium, and zirconium.

In this invention, it is more preferable that the thin film contains 65 atomic % or more oxygen at least in its upper layer.

However, in the chromium oxide film containing 60 atomic % or more oxygen, the etching rate in etching using the chlorine-based gas is not so high. Therefore, the thickness of the protective layer at the upper layer of the thin film is preferably as small as possible, for example, not greater than 1/3 of the thickness of the resist pattern. For the purpose of controlling the reflectance at the wavelength used in pattern inspection, the upper layer of the thin film may contain nitrogen. According to the study by the present inventor, even if the upper layer of the thin film contain an element such as nitrogen, the etching rate in dry etching using the substantially oxygen-free chlorine-based gas is not significantly changed as long as 60 atomic % or more oxygen is contained.

A method of forming on the substrate the thin film for forming a pattern need not be particularly limited. Among others, a sputtering deposition method is preferable. The sputtering deposition method is preferable because a uniform film having a constant thickness can be formed. In case where the chromium oxide film is deposited by the sputtering deposition method as the protective layer at the upper layer of the thin film, a chromium (Cr) target is used as a sputtering target. As a sputtering gas introduced into a chamber, use is made of a mixture of an inert gas, such as an argon gas or a helium gas, and oxygen.

The above-mentioned thin film is not limited to a single-layer film but may be a multi-layer film. For example, the above-mentioned thin film may comprise a laminate film including the protective layer at the upper layer and another layer (for example, a light-shielding layer). Alternatively, the above-mentioned thin film may be a gradient composition film having different contents of an element such as oxygen in a depth direction so that compositions vary stepwise or continuously between the protective layer at the upper layer and another layer (for example, a light-shielding layer). In order to form the thin film as the gradient composition film, use is preferably made of a method in which the type (composition) of the sputtering gas is appropriately changed during sputtering deposition.

Furthermore, the mask blank according to this invention may comprise the thin film and a resist film formed on the thin film, as will later be described in connection with embodiments.

As described in Structure 7, this invention provides a method of manufacturing an exposure mask, wherein the thin film of the mask blank is patterned by dry etching using an etching gas substantially free from oxygen. Preferably, the etching gas is a chlorine-based gas substantially free from oxygen (Structure 8).

Furthermore, as described in Structure 9, this invention provides a method of manufacturing an imprint template, wherein the thin film of the mask blank is patterned by dry etching using an etching gas substantially free from oxygen to form a thin film pattern and the substrate is etched using the thin film pattern as a mask.

It is known that the chromium oxide forming the protective layer of the thin film in the mask blank of this invention and containing a high concentration of oxygen is resistant against etching using a fluorine-based gas. Therefore, in case where a phase shift mask is produced, the thin film comprising a chromium oxide layer containing 60 atomic % or more oxygen is dry-etched using an oxygen-free chlorine gas to form a thin film pattern and, using the thin film pattern as a mask, it is possible to process a halftone phase shift film, such as a MoSiN film, which can be dry-etched using a fluorine-based gas, and a substrate, such as a quartz substrate, which can be dry-etched using a fluorine-based bas.

In manufacture of the imprint template, a quartz substrate or the like is dry-etched with the above-mentioned thin film pattern used as a mask. In this case, the thin film pattern need not have a light-shielding function. Therefore, by the method of reducing the thickness of the thin film, a fine pattern having a certain level of accuracy is obtained. However, since the dimensional accuracy of the thin film pattern directly affects the pattern shape of the quartz substrate to be etched, it is most effective to use a method of producing an optical member according to this invention, as clearly understood.

In case where the thin film containing at least one of tantalum, hafnium, and zirconium as a main component is dry-etched using an oxygen-free chlorine-based gas, it is necessary to reduce oxygen generated from various parts in a dry-etching apparatus. Those parts include an inner wall of the dry-etching apparatus, a substrate holder, and a substrate exposed during pattern formation. If oxygen is generated in the etching apparatus during dry etching of the thin film containing at least one of tantalum, hafnium, and zirconium as a main component, the dry etching rate of the thin film is significantly decreased. Furthermore, if quartz is used in the parts inside the etching apparatus, a deposition containing silicon and oxygen may be formed on an exposed surface of the thin film pattern or side surfaces of the resist pattern. With the increase in amount of oxygen generated during etching, the deposition becomes evident.

In order to avoid occurrence of the deposition, there are techniques of using, inside the etching apparatus, a material hardly causing oxygen and a deposition-forming substance to be generated and of adding a reaction consuming oxygen generated in the etching apparatus. In case where a glass is used as a substrate of the photomask or the imprint template to be subjected to etching, oxygen is generated from the exposed surface of the substrate. It is therefore preferable to at least add a reaction consuming oxygen. Specifically, a material containing carbon is supplied during etching to thereby consume oxygen generated from the parts inside the etching apparatus. In order to supply the material containing carbon, use may be made of methods of adding a carbon-containing gas to the etching gas, ensuring that a photoresist remains during etching, and simultaneously etching a substrate holder comprising resin or carbon.

According to this invention, it is possible to provide a mask blank capable of forming a fine pattern with high pattern accuracy in manufacture of an exposure mask.

According to this invention, it is possible to provide an exposure mask or an imprint template provided with a high-accuracy fine pattern formed by the above-mentioned mask blank.

DESCRIPTION OF THE EXEMPLARY EMBODIMENTS

Figure 1:
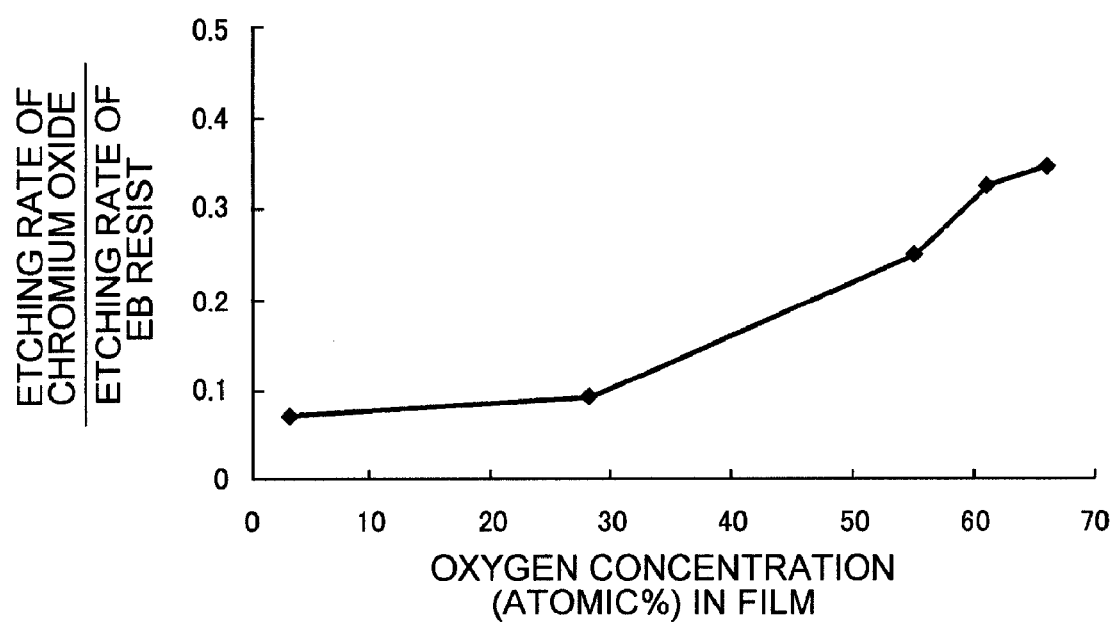
FIG. 1 is a view showing the relationship between an oxygen concentration in a chromium oxide film and an etching rate.

Now, several exemplary embodiments of this invention will be described in detail with reference to the drawing.

First Embodiment

As a first embodiment, a binary mask for exposure by an ArF excimer laser will be described. FIGS. 2A to 2D show a manufacturing process of the binary mask according to the first embodiment.

A mask blank 10 used in this embodiment comprises a light-transmitting substrate 11 on which a laminate film composed of a light-shielding film 12 and a protective film 13 and serving as a thin film for forming a transfer pattern, and a resist film 14 are successively formed in this order. The mask blank 10 is prepared in the following manner.

As the light-transmitting substrate 11, a synthetic quartz substrate (having a size of 152 mm×152 mm and a thickness of 6.35 mm) was introduced into a sputtering apparatus. A target comprising an alloy of tantalum (Ta) and hafnium (Hf) (tantalum:hafnium=80:20 in atomic ratio) was sputtered by a xenon gas to deposit the light-shielding film 12 comprising a tantalum-hafnium alloy and having a thickness of 42 nm on the synthetic quartz substrate. Thereafter, without leaving in the atmosphere, a chromium target was sputtered by a mixed gas of argon and oxygen to deposit the thin film (protective film) 13 of chromium oxide (chromium:oxygen=35:65 in atomic ratio) to the thickness of 13 nm. The synthetic quartz substrate with the laminate film of the tantalum-hafnium alloy film (light-shielding film 12) and the chromium oxide film (protective film 13) thus formed was taken out from the sputtering apparatus. The resist film 14 for electron beam lithography (CAR-FEP171 manufactured by Fuji Film Arch) was applied to the thickness of 180 nm. Thus, the mask blank 10 illustrated in FIG. 2A was obtained.

Figure 2A:
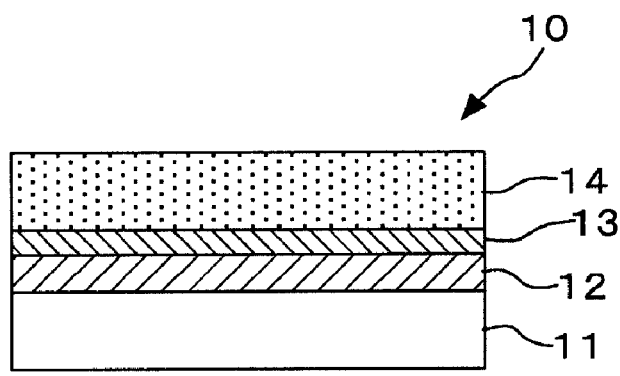
FIGS. 2A to 2D are schematic sectional views for describing a manufacturing process of a binary mask according to a first embodiment of this invention.
Figure 2B:
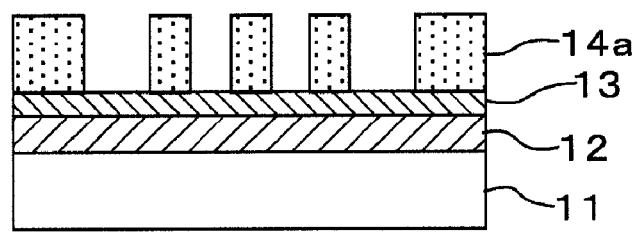

Next, using an electron beam lithographer, a plurality of patterns, such as line patterns having a width between 60 nm and 1000 nm, dot patterns, and hole patterns, and an opening for detecting an endpoint which will later be described were formed on the mask blank 10 obtained as mentioned above. Thereafter, the resist film 14 was developed to obtain the mask blank with a resist pattern 14a formed thereon as illustrated in FIG. 2B.

Figure 2C:
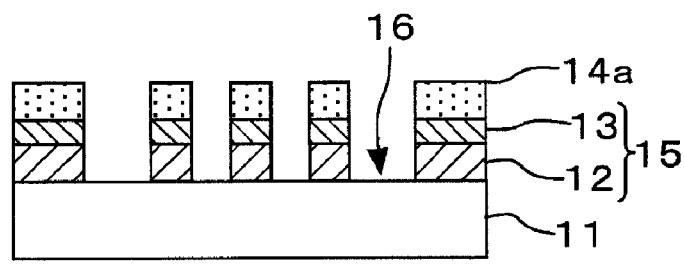

Next, the mask blank with the resist pattern 14a formed thereon was introduced into a dry etching apparatus and subjected to dry etching using an oxygen-free chlorine gas to obtain a photomask having a pattern 15 comprising the laminate film composed of the tantalum-hafnium alloy film (light-shielding film 12) and the chromium oxide film (protective film 13) as illustrated in FIG. 2C. The etching end point was detected by measuring an optical reflectance of the opening of the resist pattern. With respect to a time period from the start of etching to a time instant when the reflectance of the opening becomes equivalent to that of the quartz substrate (just etching time), overetching was performed for a time period corresponding to 30%. In order to confirm the residual thickness of the resist, a photomask for evaluation was prepared in the manner similar to that mentioned above and then broken for observation of a section of a pattern by a scanning electron microscope. As a result, the thickness of the resist, which was equal to 180 nm before etching, was reduced to about 80 nm. By observation of the section, it was also confirmed that the quartz substrate was not substantially etched at exposed portions 16.

Figure 2D:
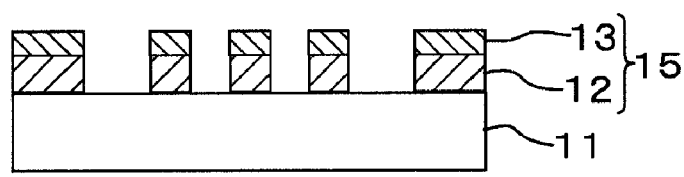

Then, the residual resist pattern 14a was removed by predetermined acid cleaning to obtain a photomask (binary mask for exposure by an ArF excimer laser) illustrated in FIG. 2D. In the photomask thus obtained, the laminate film pattern 15 composed of the light-shielding film 12 and the protective film 13 had vertical profiles in section and was excellent. The laminate film pattern 15 thus formed had a CD loss (CD error) (difference between a designed line width and a measured line width) as small as 5 nm with respect to a line pattern of 60 nm. Thus, the pattern accuracy of the laminate film pattern 15 was excellent also.

As the light-shielding film, a tantalum-boron-nitrogen alloy may be used instead of the tantalum-hafnium alloy mentioned above.

Second Embodiment

Figure 3A:
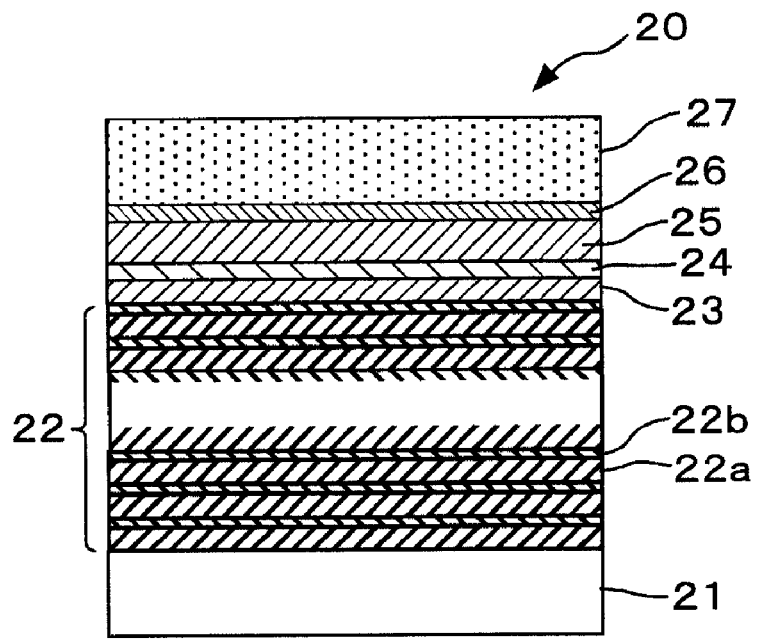
FIGS. 3A and 3B are schematic sectional views for describing a reflective mask for EUV exposure according to a second embodiment of this invention.
Figure 3B:
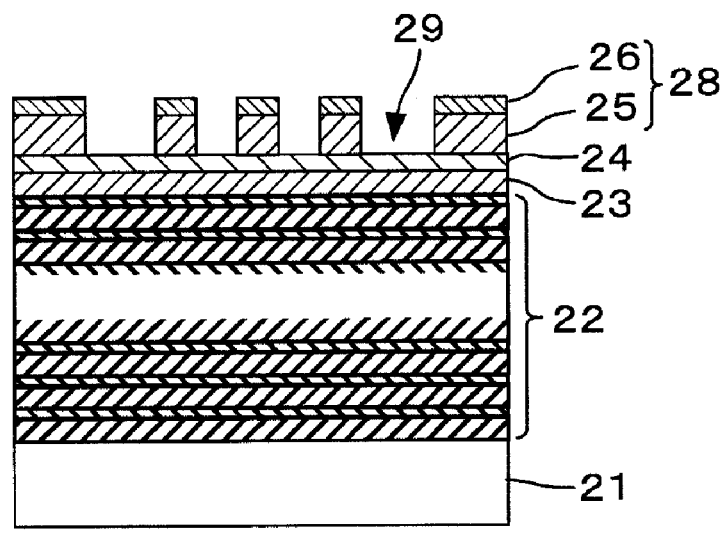

As a second embodiment, a reflective mask for EUV exposure will be described. FIGS. 3A and 3B show a manufacturing process of the reflective mask according to the second embodiment.

A reflective mask blank 20 used in this embodiment comprises a substrate 21 on which a multilayer reflective film 22 for reflecting exposure light, a silicon film 23 formed on the multilayer reflective film 22, and a ruthenium-niobium alloy film 24, a laminate film which is composed of an absorber film 25 for absorbing the exposure light (for preventing reflection of the exposure light) and a protective film 26 and which serves as a thin film for forming a transfer pattern, and a resist film 27 are successively formed in this order. The ruthenium-niobium alloy film 24 serves to protect the multilayer reflective film 22 from the environment during patterning and pattern correction of the laminate film composed of the absorber film 25 and the protective film 26.

The reflective mask blank 20 was produced in the following manner.

As the substrate 21, a low-expansion glass substrate (having a size of 152 mm×152 mm and a thickness of 6.35 mm) was introduced into a sputtering apparatus. The multilayer reflective film 22 was deposited which comprises an alternate laminate film formed by laminating 40 cycles of silicon films 22a and molybdenum films 22b where one cycle comprises a laminate of a silicon film and a molybdenum film. The thicknesses of the silicon films 22a and the molybdenum films 22b were adjusted so that the silicon film:the molybdenum film=4 nm:3 nm. Subsequently, in the same sputtering apparatus, the silicon film 23 having a thickness of 4 nm was deposited. Furthermore, the substrate with the silicon film 23 deposited at the top was introduced into another sputtering apparatus. A target comprising an alloy of ruthenium (Ru) and niobium (Nb) (ruthenium:niobium=80:20 in atomic ratio) was sputtered using an argon gas to deposit the ruthenium-niobium alloy film 24 having a thickness of 2.5 nm. Thus, a substrate with the multilayer reflective film was produced.

Next, a target comprising an alloy of tantalum (Ta) and boron (B) (tantalum:boron=80:20 in atomic ratio) was sputtered by a mixed gas of xenon and nitrogen (xenon:nitrogen=20 sccm:6 sccm) to form the absorber film 25 comprising a tantalum-boron-nitrogen alloy and having a thickness of 67 nm on the ruthenium-niobium alloy film 24. Thereafter, without leaving in the atmosphere, a chromium target was sputtered by a mixed gas of argon and oxygen to deposit the thin film (protective film) 26 of chromium oxide (chromium:oxygen=35:65 in atomic ratio) to the thickness of 13 nm. The substrate with the laminate film of the tantalum-boron-nitrogen alloy film (absorber film 25) and the chromium oxide film (protective film 26) formed at the top was taken out from the sputtering apparatus. The resist film 27 for electron beam lithography (CAR-FEP171 manufactured by Fuji Film Arch) was applied to the thickness of 180 nm. Thus, the reflective mask blank 20 illustrated in FIG. 3A was obtained.

Next, using an electron beam lithographer, a plurality of patterns, such as line patterns having a width between 80 nm and 1000 nm, dot patterns, and hole patterns, and an opening for detecting an endpoint which will later be described were formed on the resist film 27 of the reflective mask blank 20. Thereafter, the resist film 27 was developed to obtain a resist pattern.

Next, the mask blank with the resist pattern formed thereon was introduced into a dry etching apparatus and subjected to dry-etching using an oxygen-free chlorine gas to obtain a reflective mask having a pattern 28 comprising the laminate film composed of the tantalum-boron-nitrogen alloy film (absorber film 25) and the chromium oxide film (protective film 26) as illustrated in FIG. 3B. The etching end point was detected by measuring an optical reflectance of the opening of the resist pattern. With respect to a time period from the start of etching to a time instant when the reflectance of the opening becomes equivalent to that of the surface of the ruthenium-niobium alloy film 24 (just etching time), 30% overetching was performed. In order to confirm the residual thickness of the resist, a reflective mask for evaluation was prepared in the manner similar to that mentioned above and then broken for observation of a section of a pattern by a scanning electron microscope. As a result, the thickness of the resist, which was equal to 180 nm before etching, was reduced to about 70 nm. By analysis of the composition and observation of the section, it was also confirmed that the ruthenium-niobium alloy film 24 remains at exposed portions 29.

Then, the residual resist pattern was removed by predetermined acid cleaning to obtain a reflective mask for EUV exposure illustrated in FIG. 3B. In the reflective mask thus obtained, the laminate film pattern 28 composed of the absorber film 25 and the protective film 26 had vertical profiles in section and was excellent. The laminate film pattern 28 thus formed had a CD loss (CD error) (difference between a designed line width and a measured line width) as small as 6 nm with respect to a line pattern of 80 nm. Thus, the pattern accuracy of the laminate film pattern 28 was excellent also.

Third Embodiment

Figure 4A:
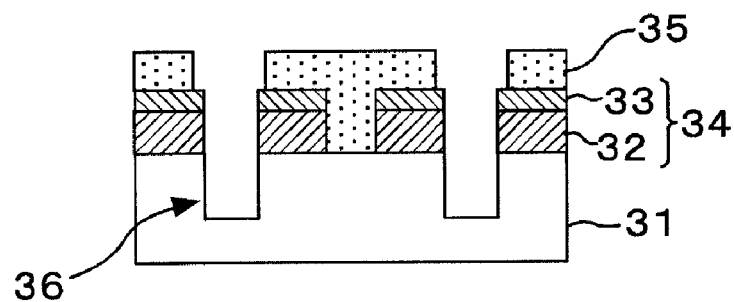
FIGS. 4A and 4B are schematic sectional views for describing a phase shift mask according to a third embodiment of this invention.
Figure 4B:
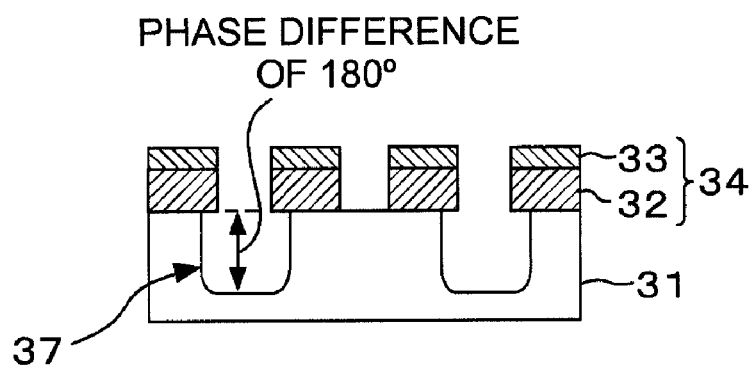

As a third embodiment, a phase shift mask for exposure by an ArF excimer laser will be described. FIGS. 4A and 4B show a manufacturing process of the phase shift mask according to the third embodiment.

A mask blank used in this embodiment comprises a light-transmitting substrate 31 on which a laminate film composed of a light-shielding film 32 and a protective film 33 and serving as a thin film for forming a transfer pattern, and a resist film are successively formed in this order.

The mask blank is prepared in the following manner like in the first embodiment. A target comprising an alloy of tantalum (Ta) and hafnium (Hf) (tantalum:hafnium=80:20 in atomic ratio) was sputtered by a xenon gas to deposit the light-shielding film 32 comprising a tantalum-hafnium alloy and having a thickness of 42 nm on a synthetic quartz substrate as the light-transmitting substrate 31. Thereafter, a chromium target was sputtered by a mixed gas of argon and oxygen to deposit the thin film (protective film) 33 of chromium oxide (chromium:oxygen=35:65 in atomic ratio) to the thickness of 13 nm. On the synthetic quartz substrate with the laminate film of the tantalum-hafnium alloy film (light-shielding film 32) and the chromium oxide film (protective film 33) thus formed, the resist film for electron beam lithography (CAR-FEP171 manufactured by Fuji Film Arch) was applied to the thickness of 180 nm. Thus, the mask blank used in this embodiment was obtained.

Next, using an electron beam lithographer, a plurality of patterns having a width of 60 nm and an opening for detecting an endpoint were formed on the mask blank obtained as mentioned above. Thereafter, the resist film was developed to form a predetermined resist pattern.

Next, using the resist pattern as a mask, dry etching using an oxygen-free chlorine gas was performed to produce a pattern 34 comprising the tantalum-hafnium alloy film (light-shielding film 32) and the chromium oxide film (protective film 33) (see FIG. 4A).

Then, a resist film for electron beam lithography (CAR-FEP171 manufactured by Fuji Film Arch) was applied again to the thickness of 180 nm. By electron beam lithography and development, a predetermined resist pattern 35 (FIG. 4A) was formed. Subsequently, with the resist pattern 35 and the laminate film pattern 34 used as a mask, the quartz substrate (substrate 31) was dry etched using a fluorine-based ($CHF_3$) gas. Thus, a quartz pattern 36 illustrated in FIG. 4A was formed.

Furthermore, wet etching was performed using a mixed solution of hydrofluoric acid and ammonium fluoride (HF concentration of 1 wt %, $NH_4F$ concentration of 39.2 wt %) to form a quartz pattern 37 illustrated in FIG. 4B. At this time, the depth of the quartz pattern 37 was adjusted so that the phase of a light beam of the ArF excimer laser (having a wavelength of 193 nm) was inverted by 180°.

Then, the residual resist was removed by predetermined acid cleaning to obtain a phase shift mask having the structure illustrated in FIG. 4B. In the phase shift mask thus obtained, the laminate film pattern 34 had vertical profiled in section and was excellent. The laminate film pattern 34 had excellent pattern accuracy. Therefore, the quartz patterns 36 and 37 formed using the laminate film pattern 34 as a mask were excellent in dimensional accuracy also.

Fourth Embodiment

Figure 5A:
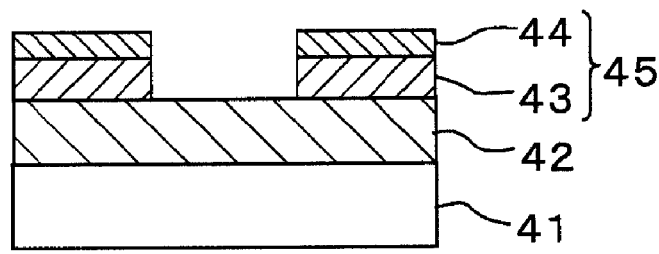
FIGS. 5A to 5C are schematic sectional views for describing a halftone phase shift mask according to a fourth embodiment of this invention.
Figure 5B:
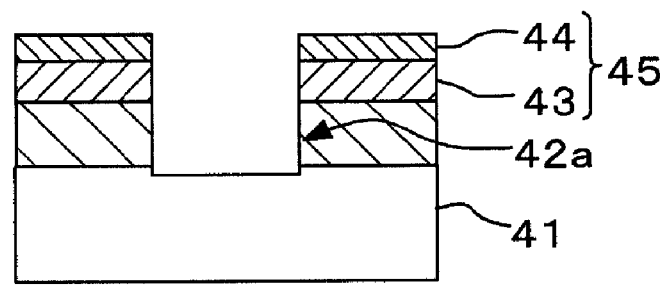
Figure 5C:
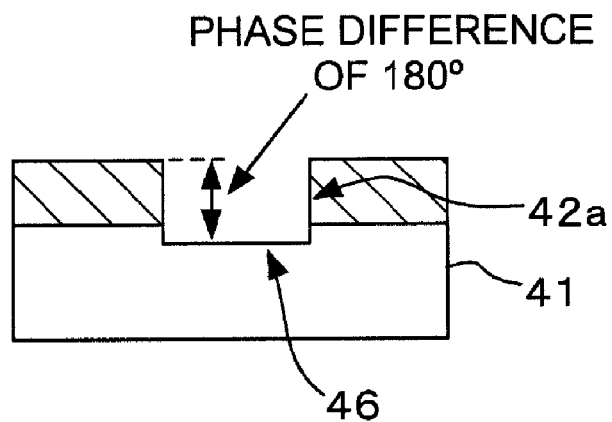

As a fourth embodiment, a halftone phase shift mask for exposure by an ArF excimer laser will be described. FIGS. 5A to 5C show a manufacturing process of the halftone phase shift mask according to the fourth embodiment.

A mask blank used in this embodiment comprises a light-transmitting substrate 41 on which a halftone phase shift film 42, a laminate film composed of a light-shielding film 43 and a protective film 44, and a resist film are successively formed in this order. The mask blank is prepared in the following manner.

As the light-transmitting substrate 41, a synthetic quartz substrate (having a size of 152 mm×152 mm and a thickness of 6.35 mm) was introduced into a sputtering apparatus. A target comprising an alloy of molybdenum and silicon (molybdenum:silicon=10:90 in atomic ratio) was sputtered by a nitrogen gas to deposit the halftone phase shift film 42 comprising a molybdenum-silicon-nitrogen (MoSiN) film and having a thickness of 67 nm on the quartz substrate.

Subsequently, the light-shielding film 43 comprising an alloy of tantalum (Ta) and hafnium (Hf) (tantalum:hafnium=80:20 in atomic ratio) and having a thickness of 42 nm was deposited on the phase shift film 42. Thereafter, the thin film (protective film) 44 of chromium oxide (chromium:oxygen=35:65 in atomic ratio) was deposited to the thickness of 13 nm. Next, the resist film for electron beam lithography (CAR-FEP171 manufactured by Fuji Film Arch) was applied to the thickness of 180 nm. Thus, the mask blank used in this embodiment was obtained.

Next, using an electron beam lithographer, a plurality of patterns having a width of 60 nm and an opening for detecting an endpoint were formed on the mask blank obtained as mentioned above. Thereafter, the resist film was developed to form a predetermined resist pattern. Like in the first embodiment, using the resist pattern as a mask, dry etching using an oxygen-free chlorine gas was performed to produce a laminate film pattern 45 comprising a laminate film of the tantalum-hafnium alloy film (light-shielding film 43) and the chromium oxide film (protective film 44) (see FIG. 5A).

Next, with the laminate film pattern 45 used as a mask, dry etching was performed using a fluorine-based ($CF_4$) gas to form a pattern 42a of the molybdenum-silicon-nitrogen film (phase shift film 42) (see FIG. 5B). The depth of the pattern of the molybdenum-silicon-nitrogen film was adjusted by determining the film thickness upon preparation of the blank so that the phase of the light beam of the ArF excimer laser (having a wavelength of 193 nm) was inverted by 177° smaller by 3° than 180°, taking into account a recess to be formed in the quartz substrate 41 by overetching.

By dry etching using a chlorine gas, the laminate film pattern 45 was removed to obtain a halftone phase shift mask having the structure illustrated in FIG. 5C. At this time, an exposed quartz substrate surface 46 was slightly etched and, as a consequence, the phase shift film (molybdenum-silicon-nitrogen film) had a pattern depth such that the phase of the light beam having a wavelength of 193 nm was inverted by 180°.

In the halftone phase shift mask thus obtained, the laminate film pattern 45 had vertical profiles in section and was excellent. The laminate film pattern 45 had excellent pattern accuracy. Therefore, the pattern 42a of the phase shift mask 42, which was formed using the laminate film pattern 45 as a mask, was excellent in dimensional accuracy also.

Fifth Embodiment

Figure 6:
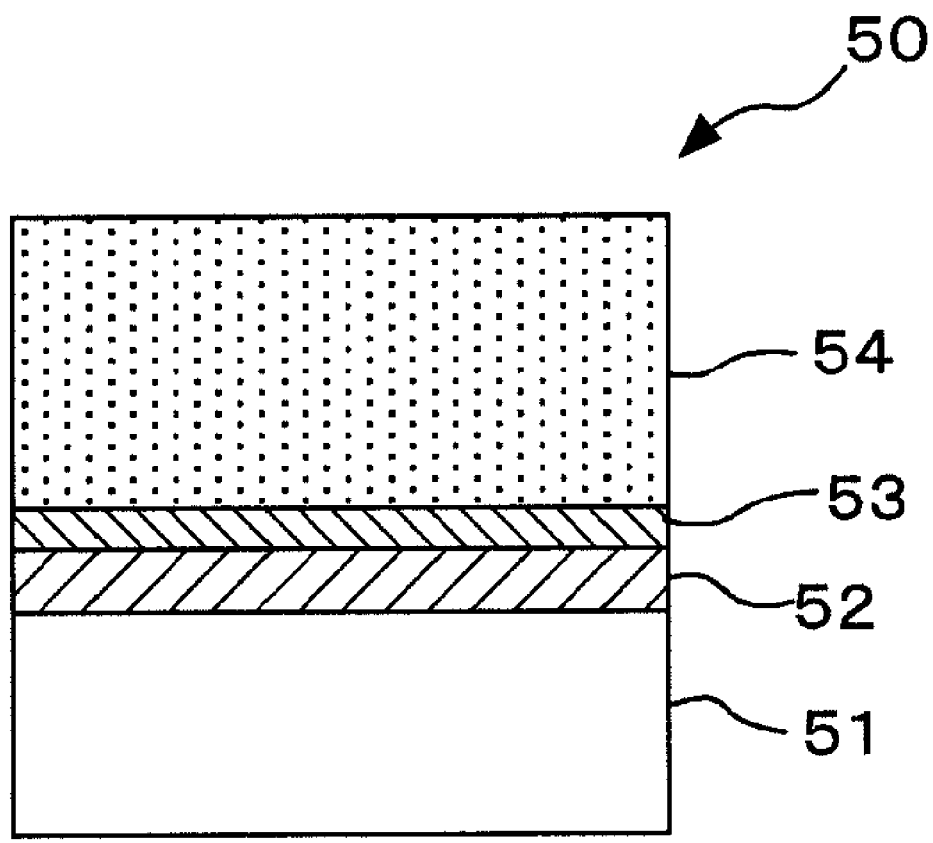
FIG. 6 is a schematic sectional view of a mask blank for use in manufacture of an imprint template according to a fifth embodiment of this invention.

As a fifth embodiment, an imprint template will be described. FIG. 6 shows a mask blank for use in manufacture of the template according to the fifth embodiment. FIGS. 7A to 7E show a manufacturing process of the template.

Referring to FIG. 6, a mask blank 50 for use in this embodiment comprises a light-transmitting substrate 51 on which a laminate film composed of a light-shielding film 52 and a protective film 53, and a resist film 54 are successively formed in this order. The mask blank 50 is prepared in the following manner.

As the light-transmitting substrate 51, a synthetic quartz substrate (having a size of 152 mm×152 mm and a thickness of 6.35 mm) was introduced into a sputtering apparatus. A target comprising an alloy of tantalum (Ta) and hafnium (Hf) (tantalum:hafnium=80:20 in atomic ratio) was sputtered by an argon gas to deposit the light-shielding film 52 comprising a tantalum-hafnium alloy and having a thickness of 10 nm on the synthetic quartz substrate. Thereafter, without leaving in the atmosphere, a chromium target was sputtered by a mixed gas of argon and oxygen to deposit the thin film (protective film) 53 of chromium oxide (chromium:oxygen=35:65 in atomic ratio) to the thickness of 5 nm. On the quartz substrate with the laminate film of the tantalum-hafnium alloy film (light-shielding film 52) and the chromium oxide film (protective film 53) formed thereon, the resist film 54 for electron beam lithography (ZEP-5200 manufactured by ZEON) was applied to the thickness of 70 nm. Thus, the mask blank 50 for use in this embodiment was obtained.

Next, using an electron beam lithographer, a plurality of patterns having a width of 30 nm and an opening for detecting an endpoint which will later be described were formed on the resist film 54 of the mask blank 50. Thereafter, the resist film 54 was developed to form a template blank.

Figure 7A:
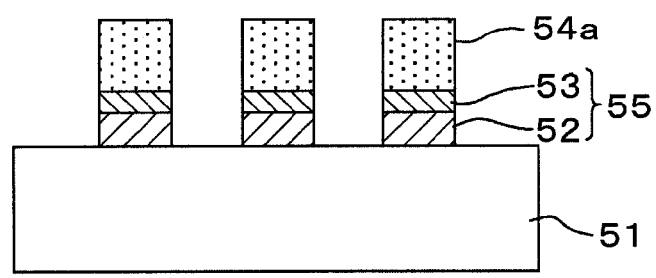
FIGS. 7A to 7E are schematic sectional views for describing a manufacturing process of the imprint template according to the fifth embodiment of this invention.
Figure 7B:
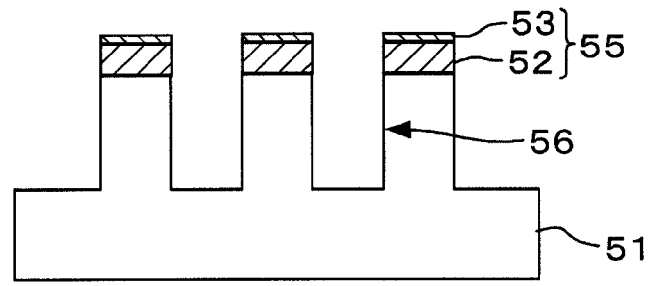
Figure 7C:
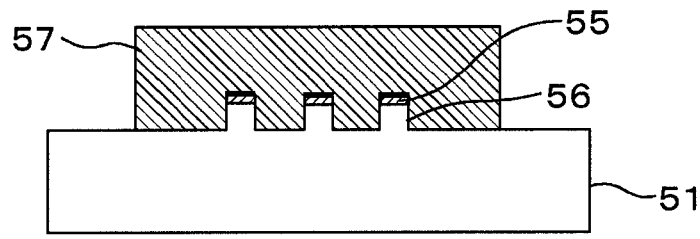

Next, the template blank with the resist pattern 54a formed thereon was introduced into a dry etching apparatus and subjected to dry-etching using an oxygen-free chlorine gas to produce a pattern 55 comprising the laminate film composed of the tantalum-hafnium alloy film (light-shielding film 52) and the chromium oxide film (protective film 53) as illustrated in FIG. 7A. The etching end point was detected by measuring an optical reflectance of the opening of the resist pattern. With respect to a time period from the start of etching to a time instant when the reflectance of the opening becomes equivalent to that of the quartz substrate (just etching time), 30% overetching was performed. In order to confirm the residual thickness of the resist, a blank for evaluation was prepared in the manner similar to that mentioned above and then broken for observation of a section of a pattern by a scanning electron microscope. As a result, the thickness of the resist, which was equal to 70 nm before etching, was reduced to about 30 nm. Simultaneously, it was also confirmed that the quartz substrate was not substantially etched at exposed portions without the laminate film pattern 55.

Next, the template blank provided with the laminate film pattern 55 composed of the tantalum-hafnium alloy film (light-shielding film 52) and the chromium oxide film (protective film 53) was introduced again into the dry etching apparatus and subjected to dry-etching using a fluorine-based ($CHF_3$) gas. Thus, with the laminate film pattern 55 used as a mask, the quartz substrate was etched to form a quartz pattern 56 illustrated in FIG. 7B. At this time, the etching time was adjusted so that the depth of the quartz pattern 56 was equal to 70 nm. In order to confirm a sectional shape of the pattern, a blank for evaluation was prepared in the manner similar to that mentioned above and then broken for observation of a section of a pattern by a scanning electron microscope. As a result, the resist pattern disappeared and the surface of chromium oxide was exposed. The thickness of chromium oxide was reduced to about 3 nm with respect to 5 nm before etching. On the other hand, the width of the pattern comprising the laminate film of the tantalum-hafnium alloy film and the chromium oxide film was not substantially changed as compared with the width before dry etching of the quartz substrate. It was also confirmed that the width of the quartz pattern 56 was approximately equal to that of the laminate film pattern 55 and that the depth of the quartz pattern 56 was uniform.

Next, a photoresist (iP3500 manufactured by TOKYO OHKA KOGYO) was applied to the thickness of 460 nm onto the template blank provided with the quartz pattern 56 and subjected to ultraviolet exposure and development. Thus, a resist pattern 57 for a base structure illustrated in FIG. 7C was formed.

Figure 7D:
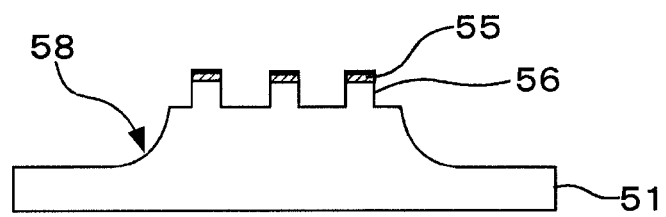
Figure 7E:
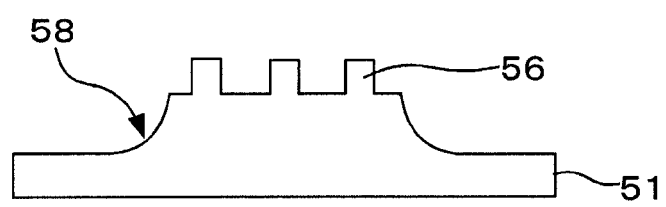

Next, the template blank provided with the resist pattern 57 was subjected to wet etching using a mixed solution of hydrofluoric acid and ammonium fluoride (HF concentration of 4.6 wt %, $NH_4F$ concentration of 36.4 wt %). Then, the resist was removed by predetermined acid cleaning to form a base structure 58 having a depth of, for example, about 15 μm as illustrated in FIG. 7D. By dry etching using a chlorine gas, the laminate film pattern 55 was removed to obtain an imprint template having the structure illustrated in FIG. 7E.

In the imprint template thus obtained, the laminate film pattern 55 had vertical profiles in section and was excellent. The laminate film pattern 55 had excellent pattern accuracy. Therefore, the quartz pattern 56 formed using the laminate film pattern 55 as a mask was excellent in dimensional accuracy also.

In the fifth embodiment, the protective film 53 alone may be formed without the light-shielding film 52. In this case, if the content of oxygen in the protective film of chromium oxide is 60 atomic % or more, electrical conductivity may be decreased to cause charge up during lithography. In order to avoid this problem, a conductive film is preferably formed on the resist film.

Although this invention has been described in conjunction with the several exemplary embodiments thereof, this invention may be modified in various other manners within the scope of the appended claims.

What is claimed is:

1. A mask blank, comprising:
a substrate, and
a thin film formed on the substrate and used to form a pattern,
wherein the mask blank is adapted to be subjected to dry etching corresponding to a method of producing an exposure mask by patterning the thin film by dry etching using a chlorine-based etching gas substantially free from oxygen with a resist pattern formed on the thin film used as a mask;
the thin film having a protective layer formed at least at an upper layer, the upper layer containing 60 atomic % or more oxygen,
wherein the protective layer contains, as a main component except for the oxygen, chromium (Cr).

2. The mask blank according to claim 1, wherein the upper layer contains 65 atomic % or more oxygen.

3. The mask blank according to claim 1, wherein the thin film comprises a laminate film composed of the protective layer and a light-shielding layer.

4. The mask blank according to claim 1, wherein a remaining part of the thin film except the upper layer is formed by a material containing, as a main component, at least one element selected from tantalum (Ta), hafnium (Hf), and zirconium (Zr).

5. A method of manufacturing an exposure mask, wherein the thin film of the mask blank according to claim 1 is patterned by dry etching using a chlorine-based etching gas substantially free from oxygen.

6. A method of manufacturing an imprint template, comprising:
providing a mask blank having a substrate, and a thin film formed on the substrate that is used to form a pattern, the thin film having a protective layer formed at least at an upper layer, the upper layer containing 60 atomic % or more oxygen, and the protective layer contains, as a main component except for the oxygen, chromium (Cr);
providing a chlorine-based etching gas substantially free from oxygen to the thin film;
patterning the thin film by dry etching using an etching gas substantially free from oxygen to form a thin film pattern; and
etching the substrate using the thin film pattern as a mask.

7. A mask blank, comprising:
a substrate, and
a thin film formed over on the substrate,
wherein:
the thin film comprises a first film and a second film formed on the first film, the first film is formed by a material containing, as a main component, at least one element selected from tantalum (Ta), hafnium (Hf), and zirconium (Zr), and the second film contains oxygen of 60 atomic % or more and chromium (Cr) as a main component except the oxygen so as to serve as a proactive film.

8. The mask blank according to claim 7, further comprising:

a phase shift film capable of etching by a fluorine-based gas between the substrate and the thin film.

9. The mask blank according to claim 7, further comprising:

a multilayer reflective film for reflecting exposure light between the substrate and the thin film, wherein the first film is an absorber film for absorbing the exposure light.

10. A method of manufacturing a reflective mask, comprising:

providing a mask blank having a substrate and a thin film formed over on the substrate, wherein the thin film comprises a first film and a second film formed on the first film, the first film being formed by a material containing, as a main component, at least one element selected from tantalum (Ta), hafnium (Hf), and zirconium (Zr), and the second film containing oxygen of 60 atomic % or more and chromium (Cr) as a main component except the oxygen so as to serve as a proactive film; and patterning the thin film of the mask blank by dry etching using a chlorine-based etching gas substantially free from oxygen.

* * * * *